(12) United States Patent
Nagatomo et al.

(10) Patent No.: US 7,535,946 B2
(45) Date of Patent: May 19, 2009

(54) STRUCTURE USING PHOTONIC CRYSTAL AND SURFACE EMITTING LASER

(75) Inventors: Yasuhiro Nagatomo, Hachioji (JP);
Yuichiro Hori, Kawasaki (JP);
Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 58 days.

(21) Appl. No.: 11/940,124

(22) Filed: Nov. 14, 2007

(65) Prior Publication Data
US 2008/0117942 A1  May 22, 2008

(30) Foreign Application Priority Data

Nov. 16, 2006 (JP) .............................. 2006-310383
Oct. 5, 2007 (JP) .............................. 2007-262270

(51) Int. Cl.
*H01S 5/00* (2006.01)
*H01S 3/08* (2006.01)

(52) U.S. Cl. .................... 372/50.124; 372/92; 372/98; 372/99

(58) Field of Classification Search ............ 372/50.124, 372/29.022, 92, 97, 99
See application file for complete search history.

(56) References Cited

U.S. PATENT DOCUMENTS

| | | | |
|---|---|---|---|
| 4,503,447 A * | 3/1985 | Iafrate et al. .................. 257/15 |
| 5,955,749 A * | 9/1999 | Joannopoulos et al. ........ 257/98 |
| 6,154,480 A * | 11/2000 | Magnusson et al. ........... 372/96 |
| 6,683,898 B2 * | 1/2004 | Østergaard et al. ........ 372/43.01 |
| 6,707,588 B2 * | 3/2004 | Takada ....................... 359/241 |
| 7,242,837 B2 * | 7/2007 | Talneau et al. .............. 385/129 |
| 7,483,466 B2 * | 1/2009 | Uchida et al. ............. 372/50.11 |
| 2001/0033409 A1 * | 10/2001 | Takada ....................... 359/241 |
| 2003/0235229 A1 * | 12/2003 | Deng et al. .................... 372/96 |
| 2005/0051785 A1 * | 3/2005 | Erchak et al. ................. 257/98 |
| 2007/0030873 A1 * | 2/2007 | Deng ....................... 372/50.11 |
| 2007/0201526 A1 | 8/2007 | Hori ..................... 372/50.124 |
| 2007/0201527 A1 | 8/2007 | Hori et al. ............. 372/50.124 |
| 2008/0259984 A1 * | 10/2008 | Nagatomo ................. 372/50.1 |

FOREIGN PATENT DOCUMENTS

JP       2001-272557      10/2001

OTHER PUBLICATIONS

Rosenberg, et al., "Guided Resonances in Asymmetrical GaN Photonic Crystal Slabs Observed in the Visible Spectrum", Optics Express, vol. 13, No. 17, pp. 6564-6571 (2005).
Li, et al., "Light Propagation in Semi-Infinite Photonic Crystals and Related Waveguide Structures", Physical Review B, vol. 68, pp. 155101-1-155101-15 (2003).

* cited by examiner

*Primary Examiner*—Minsun Harvey
*Assistant Examiner*—Phillip Nguyen
(74) *Attorney, Agent, or Firm*—Fitzpatrick, Cella, Harper & Scinto

(57) ABSTRACT

A structure includes a photonic crystal layer including a first member having a high refractive index in which a plurality of holes are periodically arranged, and a second member having a low refractive index. A third member is disposed on the first member. The third member has a refractive index higher than 1.0 and lower than the refractive index of the first member. The holes of the photonic crystal layer have a depth in the range of 20% to 80% of the thickness of the first member.

9 Claims, 14 Drawing Sheets

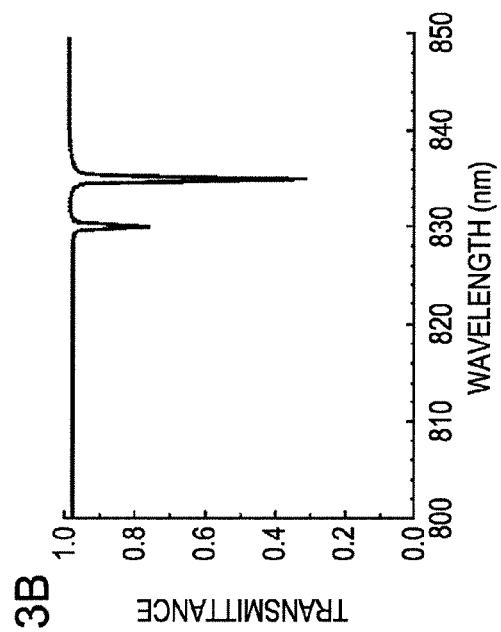
FIG. 3A
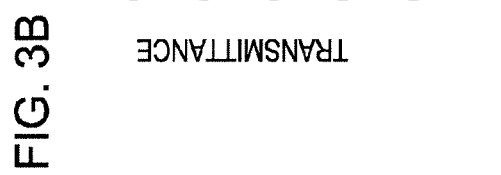
FIG. 3B
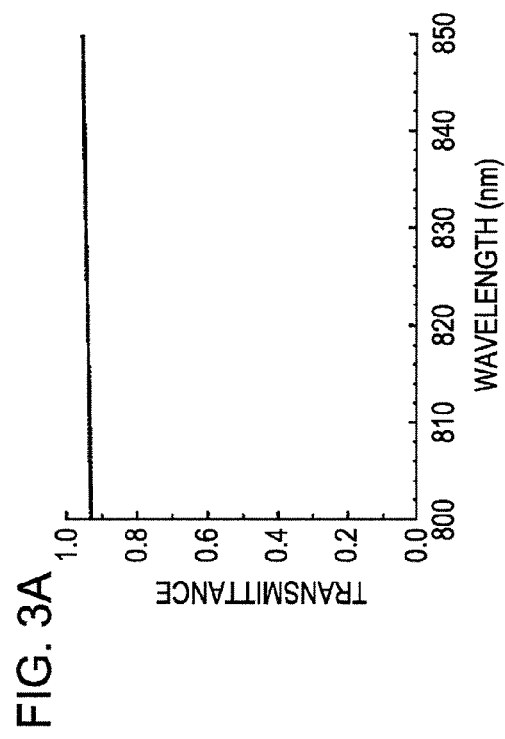
FIG. 3C
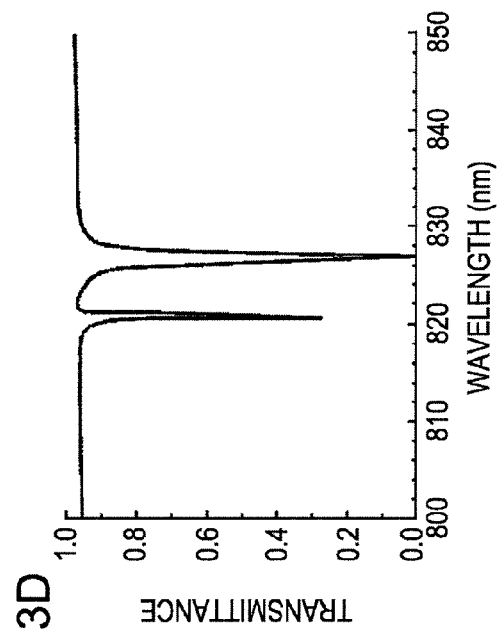
FIG. 3D
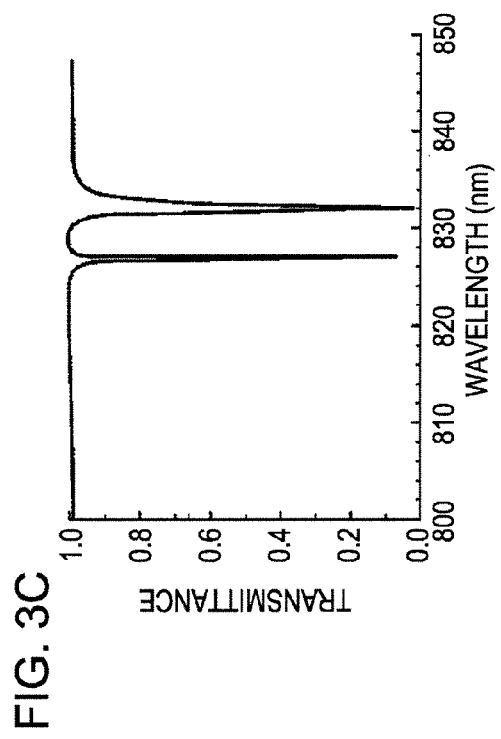

STRUCTURE USING PHOTONIC CRYSTAL AND SURFACE EMITTING LASER

BACKGROUND OF THE INVENTION

1. Field of the Invention

The present invention relates to a structure using a photonic crystal and a surface emitting laser including the structure.

2. Description of the Related Art

Optics Express, vol. 13, No. 17, p. 6564 (2005) discusses guided resonance using a photonic crystal in a shape shown in FIG. 8.

The structure shown in FIG. 8 includes a sapphire substrate 8000, a photonic crystal layer 8050 including a GaN layer 8010 having periodically provided holes 8020, and an AlN nucleation layer 8030.

Guided resonance means that guided mode light, guided in a photonic crystal having a periodic refractive index structure in its in-plane direction, is coupled with a radiation mode and is thereby emitted from the photonic crystal.

A photonic crystal can be used as a mirror by use of guided resonance. More specifically, light coming into a photonic crystal in the direction perpendicular to the in-plane direction of the photonic crystal can be converted into light guided in the photonic crystal by being coupled with light modes above the light line. The converted light is coupled with radiation mode light and thus emitted to the outside from the photonic crystal. Light reflected directly without being coupled with the guided mode light interferes with the light emitted to the outside by coupling with the guided mode light and causes peculiar reflection, for example, reflection with an efficiency of 100%.

In general, the guided mode refers to a mode satisfying the requirement that light does not leak from a photonic crystal layer, and the radiation mode refers to a mode in which light leaks from the photonic crystal layer.

A light line shows a dispersion of light propagating in a medium adjoining a waveguide layer (in this instance, photonic crystal layer), and can be represented by a line defined by an expression $w=ck/n$ (w: angular frequency; c: velocity of light; n: refractive index; k: wave number). In general, light in the region having higher frequencies than the light line can leak easily from the photonic crystal.

Thus, the operational principle of mirrors using guided resonance is different from that of mirrors using the photonic band gap.

If incident light comes perpendicularly into the photonic crystal layer shown in FIG. 8, and if that light is adjusted to have a wavelength in a region in which the reflectance is remarkably increased by guided resonance, the adjusted light is reflected with a high reflectance.

The above-cited Optics Express document discusses a simulation of how the guided resonance changes when the refractive index of the sapphire substrate 8000 adjoining the photonic crystal layer 8050 (refractive index of GaN: 2.37) varies.

FIG. 9 shows spectra (vertical axis: frequency, horizontal axis: transmittance) of guided resonance occurring in a photonic crystal layer when the refractive index (represented by n in FIG. 9) of the substrate is varied while the refractive index of the photonic crystal layer is fixed.

Also, FIG. 9 shows that as the relative refractive index difference ($\Delta n=(n_{phc}-n_{clad})/n_{phc}$) between the photonic crystal layer (refractive index: $n_{phc}$) and the substrate (refractive index: $n_{clad}$) acting as a clad layer is reduced, guided resonance becomes difficult to produce.

More specifically, when $n_{phc}=2.37$ and $n_{clad}=1.8$ (n represents $n_{clad}$ in FIG. 9), the relative refractive index difference is about 0.24 (about 24%). In this instance, guided resonance occurs as is clear from FIG. 9.

When $n_{phc}=2.37$ and $n_{clad}=2.135$, that is, when the relative refractive index difference is about 0.10 (about 10%) or less, guided resonance does not occur.

In order to apply a mirror using guided resonance in a photonic crystal to a laser, it may be required that the difference in refractive index between the photonic crystal layer and its adjoining clad layer be very small.

When, for example, a certain difference in refractive index is needed between a photonic crystal layer and its adjoining layer, air having a low refractive index can be used as the layer adjoining the photonic crystal layer. However, such a structure, a so-called air gap structure, is difficult to form by a semiconductor deposition process. Accordingly, if a photonic crystal is applied to an optical device, a structure is desired in which guided resonance can occur even though a semiconductor having a higher refractive index than air adjoins the photonic crystal layer.

When using a photonic crystal layer instead of the multilayer mirror of a surface emitting laser emitting light having a wavelength of 670 nm, a combination of an $Al_{0.5}Ga_{0.5}As$ photonic crystal layer (refractive index: 3.446) and an $Al_{0.93}Ga_{0.07}As$ clad layer (refractive index: 3.130) adjoining the photonic crystal layer may be proposed.

In this instance, the relative refractive index difference $\Delta n$ ($=(n_{phc}-n_{clad})/n_{phc}$) is about 9.2%. Hence, guided resonance is difficult to produce in the structure described in the above-cited document, and it is difficult to use the photonic crystal as an alternative to the multilayer mirror.

SUMMARY OF THE INVENTION

The present invention provides a structure in which guided resonance can occur even though the relative refractive index difference between the material of the photonic crystal layer and the material of the adjoining layer is not sufficiently large as in the case of using a GaN photonic crystal layer and a sapphire substrate, and a surface emitting laser using the structure.

According to an aspect of the present invention, a structure is provided which includes a photonic crystal layer including a first member having a first refractive index $n_1$ in which a plurality of holes are formed so as to be periodically arranged. A second member adjoins the photonic crystal layer. The second member has a second refractive index $n_2$ lower than the first refractive index $n_1$. A third member is disposed on the first member and has a third refractive index $n_3$ higher than 1.0 and lower than the first refractive index $n_1$. The first refractive index $n_1$ and the second refractive index $n_2$ satisfy the relationship $(n_1-n_2)/n_1 \leq 0.10$, and the holes of the photonic crystal layer have a depth in the range of 20% to 80% of the thickness of the first member.

According to another aspect of the present invention, a surface emitting laser is provided which includes a first reflection mirror including the above-described structure. A second reflection mirror opposes the first reflection mirror, and an active layer is disposed between the first reflection mirror and the second reflection mirror.

Further features of the present invention will become apparent from the following description of exemplary embodiments with reference to the attached drawings.

BRIEF DESCRIPTION OF THE DRAWINGS

FIGS. 3A to 3D are charts showing the hole depth dependence of the transmission spectrum of the structure shown in FIG. 2C.

DESCRIPTION OF THE EMBODIMENTS

First Embodiment

Structure Used as Mirror

A structure according to an embodiment will now be described with reference to FIGS. 1 and 2A to 2C. FIGS. 2A to 2C are sectional views taken along line II-II of FIG. 1.

Figure 1:
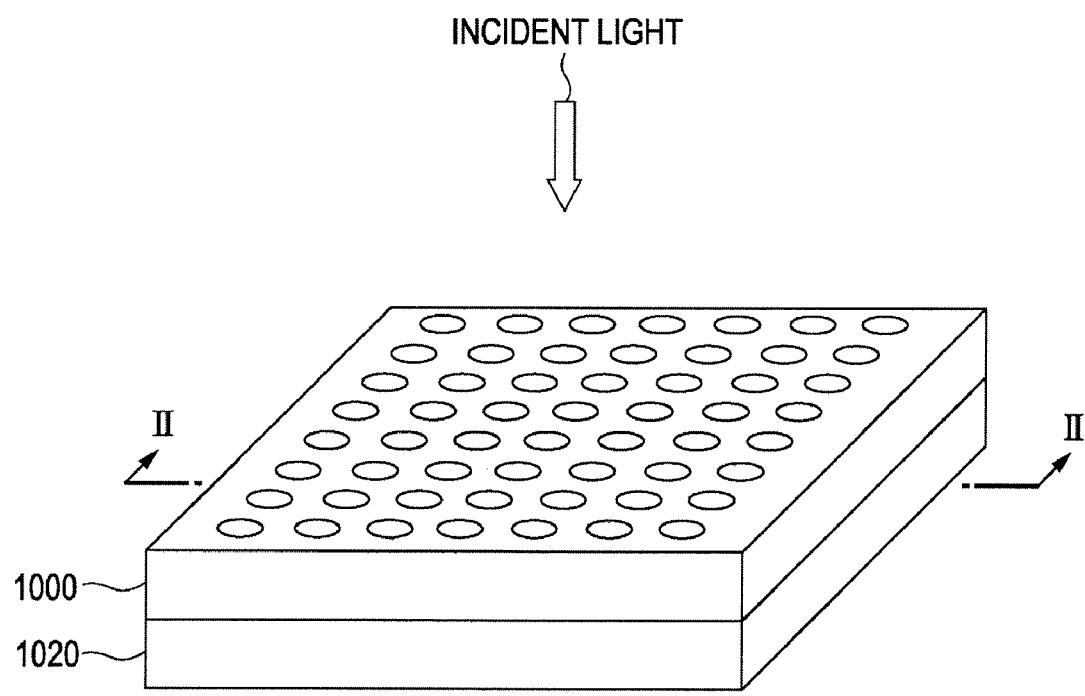
FIG. 1 is a perspective view of a photonic crystal layer according to an embodiment of the present invention.
Figure 2A:
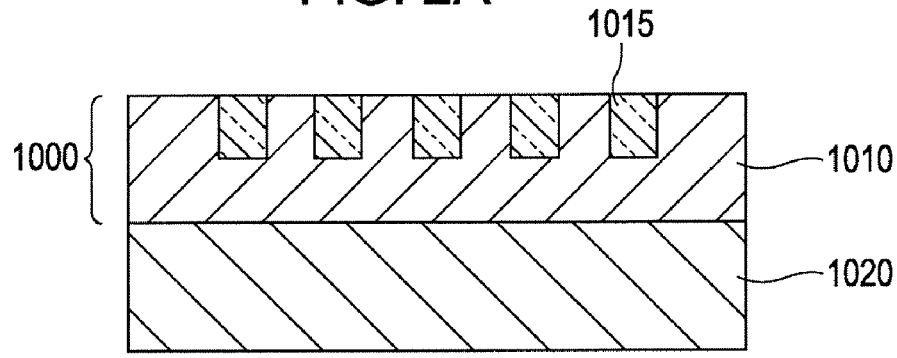
FIGS. 2A to 2C are sectional views of three types of structures using a photonic crystal layer according to an embodiment of the present invention.
Figure 2B:
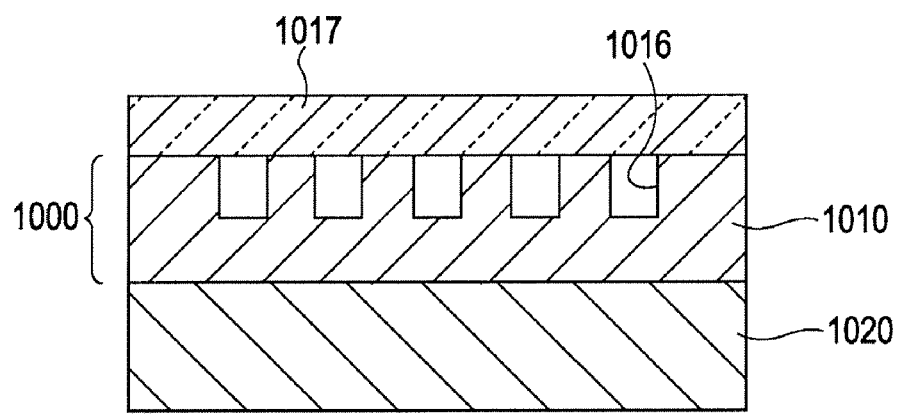
Figure 2C:
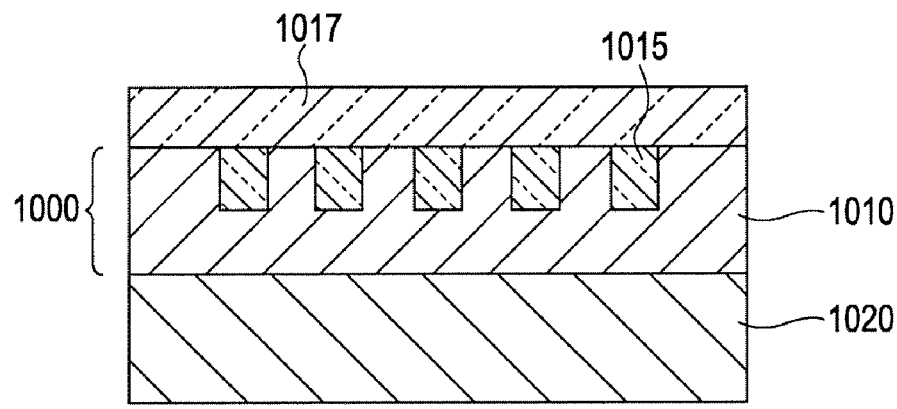
Figure 4A:
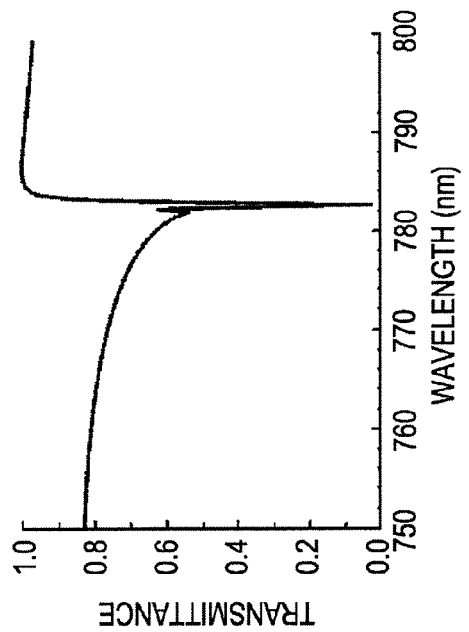
FIGS. 4A to 4D are charts showing the hole depth dependence of the transmission spectrum of the structure shown in FIG. 2C.
Figure 4B:
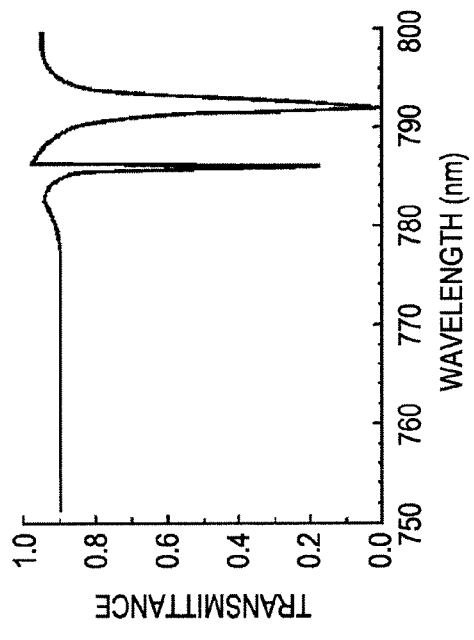
Figure 4C:
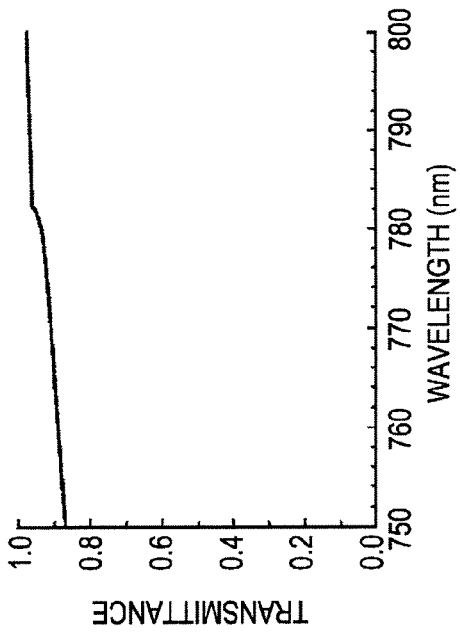
Figure 4D:
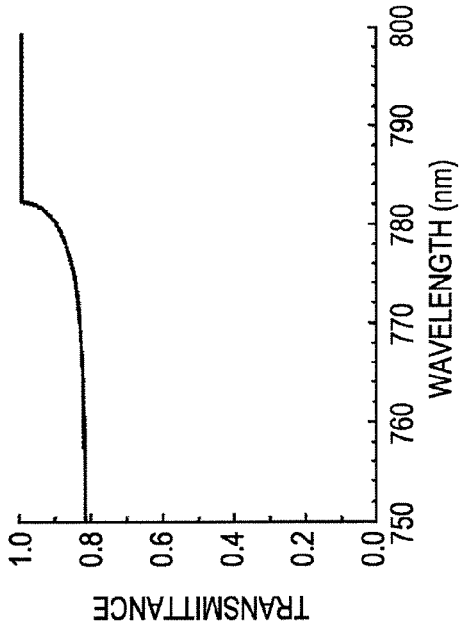

FIG. 1 shows a photonic crystal layer 1000 produced by forming periodically arranged holes in a first member (1010 in FIGS. 2A to 2C) having a first refractive index $n_1$.

The photonic crystal layer 1000 adjoins a second member (referred to as clad layer) which is a low-refractive index layer 1020 having a second refractive index $n_2$ lower than the first refractive index $n_1$.

The structure according to the present embodiment is designed so as to reflect light coming in the direction perpendicular to the in-plane direction of the photonic crystal layer 1000 shown in FIG. 1. In other words, the structure of the present embodiment is designed so as to produce guided resonance with the wavelength of incident light. In this instance, the light that has entered in the in-plane direction of the photonic crystal layer 1000 is coupled with guided mode light guided in the photonic crystal layer, then coupled with radiation mode light, and finally emitted to the outside. Thus, the structure functions as a mirror.

In the structure, the relative refractive index difference $(\Delta n = (n_1 - n_2)/n_1)$ between the first refractive index $n_1$ and the second refractive index $n_2$ is 0.10 or less.

As described above, when $\Delta n$ is 0.10 or less, guided resonance is difficult to produce as in the above-cited non-patent document.

In the present embodiment, however, a third member having a third refractive index $n_3$ of more than 1.0 is further provided on the first member 1010.

For example, the third member, disposed on the first member, may fill the holes in the photonic crystal layer 1000 as designated by reference numeral 1015 shown in FIG. 2A.

If the holes of the photonic crystal layer are not filled, the refractive index of the holes is equivalent to that of air 1.0. By filling the holes with the third member having a refractive index of more than 1.0, the effective refractive index ($n_{eff}$) of the photonic crystal layer 1000 can be increased. Hence, the difference in refractive index between the photonic crystal layer 1000 and the low-refractive index layer 1020 can be increased.

Alternatively, in order to increase the effective refractive index of the photonic crystal layer 1000, the third member, disposed on the first member, may be disposed over the photonic crystal layer 1000 as designated by reference numeral 1017 shown in FIG. 2B, but not filling the holes 1016. In other words, the third member 1017 is formed over the first member 1010. This structure can increase the effective refractive index of the photonic crystal layer 1000 because light that has entered the photonic crystal layer 1000 propagates with evanescent waves leaking, but not in a state completely confined in the first member 1010.

The refractive index (third refractive index) of the third member is lower than the refractive index (first refractive index) of the first member. If the third refractive index is higher than the first refractive index, light cannot be confined in the photonic crystal layer, and consequently, guided resonance cannot easily occur.

It is also preferable from the viewpoint of increasing the effective refractive index that the third member fill the holes and another third member having a refractive index of more than 1.0 be disposed over the photonic crystal layer 1000, as designated by reference numerals 1015 and 1017 shown in FIG. 2C. In this instance, the third member 1015 and the additional third member 1017 may not necessarily be made of the same material as long as their refractive indices are higher than 1.0.

The feature of the photonic crystal layer 1000 is that the refractive index changes periodically in the in-plane direction. The present inventors have found that when the depth of the holes is less than 20% of the thickness t of the first member 1010 (slab), light is not easily affected by the periodicity in the in-plane direction, depending on the wavelength.

For example, FIGS. 3A, 3B, 3C and 3D show the results of simulation for the dependence of the guided resonance observed in the structure shown in FIG. 2C on the depth of the holes of the structure, performed at depths of 0%, 10%, 20% and 30% of the slab thickness t, respectively. In the simulation, the first member 1010 has a refractive index of 3.446; the second member 1020, or the low-refractive index layer, has a refractive index of 3.130; and the holes are arranged in a rectangular lattice manner at a periodicity of 250 nm. The holes have a circular cross section with a radius of 100 nm. The third member 1015 and the additional third member 1017 are made of the same material having a refractive index of 2.0.

As is clear from FIGS. 3A to 3D, when the depth of the holes is reduced to less than 20% of the slab thickness t, the transmission spectrum exhibits small dips. This means that high reflectance cannot be obtained.

On the other hand, when the depth of the holes is increased to more than 80% of the slab thickness t, the following disadvantages occur.

As the depth of the holes increases, the volume of the holes is increased. If the difference in refractive index between the first member (slab) 1010 and the low-refractive index layer or second member 1020 (clad layer) is remarkably small, the effective refractive index difference between them is further reduced. Hence, it is not acceptable to form the holes deeper than a certain amount.

FIGS. 4A, 4B, 4C and 4D show the results of a simulation performed at depths of 70%, 80%, 90% and 100% in the same manner as the simulation of FIGS. 3A to 3D. As is clear from these figures, when the depth of the holes is increased to more than 80% of the slab thickness t, guided resonance does not occur.

The results of the simulation teach that the depth of the holes formed in the first member 1010 can be in the range of 20% to 80% of the thickness of the first member. First member and second member The first refractive index $n_1$ of the first member can be in the range of 1.2 to 4.0. Exemplary materials of the first member include Si, $SiO_2$, SiN, GaAs, $Al_xGa_{1-x}As$, GaN, $Al_xGa_{1-x}N$, and InP.

The second refractive index $n_2$ of the second member can be in the range of 1.0 to 3.8. Exemplary materials of the second member include $SiO_2$, SiN, $Al_xGa_{1-x}As$, AlAs, $Al_xGa_{1-x}N$, and AlN.

In order to achieve a relative refractive index difference $\Delta n$ of 0.1 or less, the first member and the second member may be made of $Al_{0.5}Ga_{0.5}As$ and $Al_{0.93}Ga_{0.07}As$, respectively.

The holes formed in the photonic crystal layer may have a circular or rectangular cross section and may be arranged in a rectangular or triangular lattice.

The thickness t of the first member is set in view of the guided mode of light and the manufacturing conditions, and can be, for example, in the range of 10 nm to 10 μm.

The third member can be made of a material having a refractive index of more than 1.0 and lower than the first refractive index $n_1$ of the first member (material having a third refractive index $n_3$). Any material can be used as long as it is transparent to light having wavelengths to be used, and examples of the third member material include polystyrene, polyethylene, acrylic resin, epoxy resin, silicone resin, melamine resin, phenol resin, fluorocarbon polymer, SiN, $SiO_2$, $TiO_2$, ITO, and GaO. In the present embodiment, the second refractive index and the third refractive index may be the same, or the third refractive index may be higher than the second refractive index.

Figure 9:
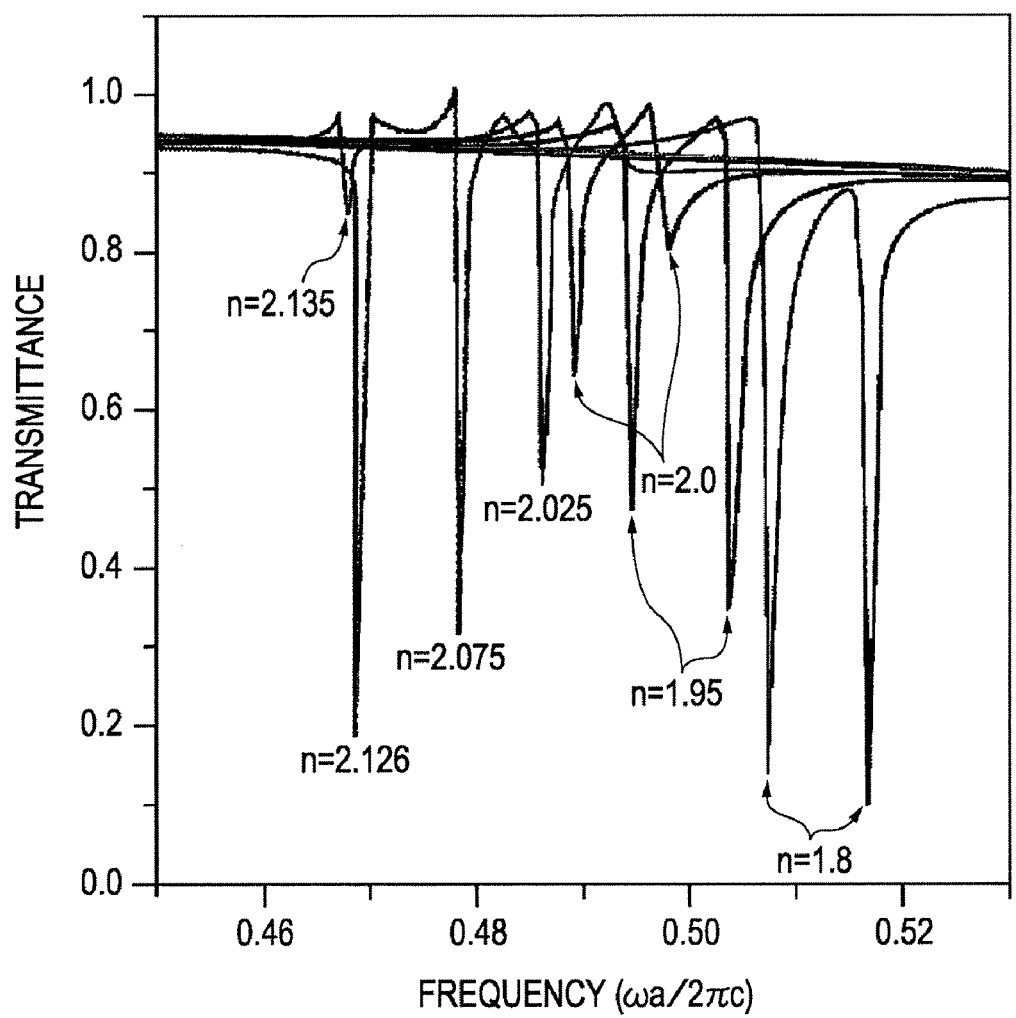
FIG. 9 is a chart of transmission spectra of the photonic crystal of the non-patent document.

The wavelength half-width of the guided resonance described in the above-cited document is estimated to be 2 nm or less in any case shown in FIG. 9. In view of the process margin for applying a mirror using guided resonance to devices, it is however preferable that the half-width is wider and, for example, 5 nm or more.

FIGS. 6A to 6D show the changes in half-width of structures having a slab thickness t equal to the depth of the holes when the radius of the holes is increased to increase the half-width. The results were obtained by calculation using the following parameters:

a: 500 nm
t: 750 nm
r: A 0.08a, B 0.10a, C 0.12a, and D 0.14a
$n_1$: 3.446 (for example, using $Al_{0.5}Ga_{0.5}As$)
$n_2$: 3.200 (for example, using $Al_{0.8}Ga_{0.2}As$)

In the parameters, the designation "a" represents the lattice constant of the photonic crystal layer (corresponding to the periodicity of the rectangular lattice), t represents the thickness of the first member (slab), r represents the radius of the holes in the photonic crystal layer, $n_1$ represents the refractive index of the first member, and $n_2$ represents the refractive index of the second member (clad layer). The structure used for the calculation is not provided with the third member over the first member.

Figure 6A:
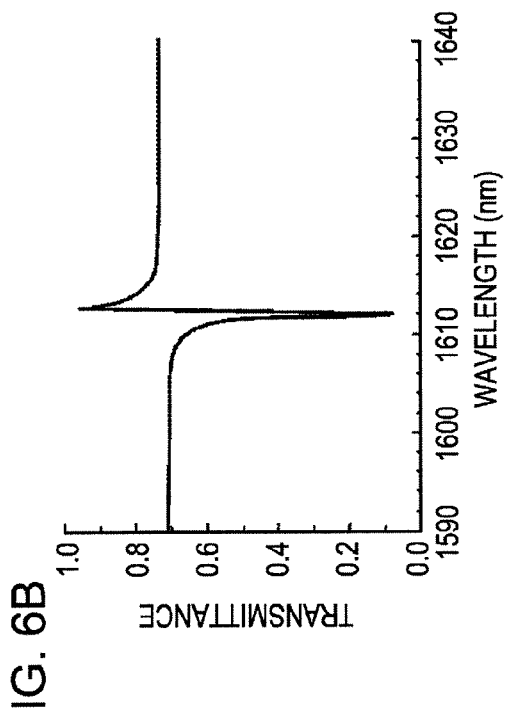
FIGS. 6A to 6D are charts showing the hole depth dependence of the transmission spectrum of a structure including a photonic crystal layer.
Figure 6B:
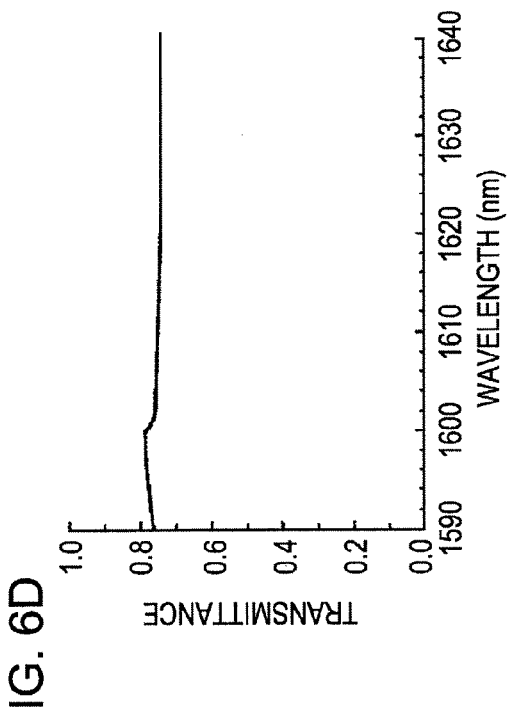
Figure 6C:
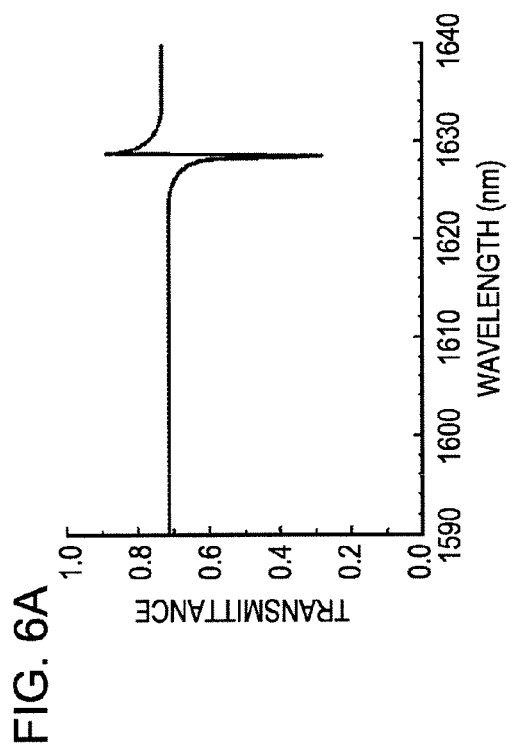
Figure 6D:
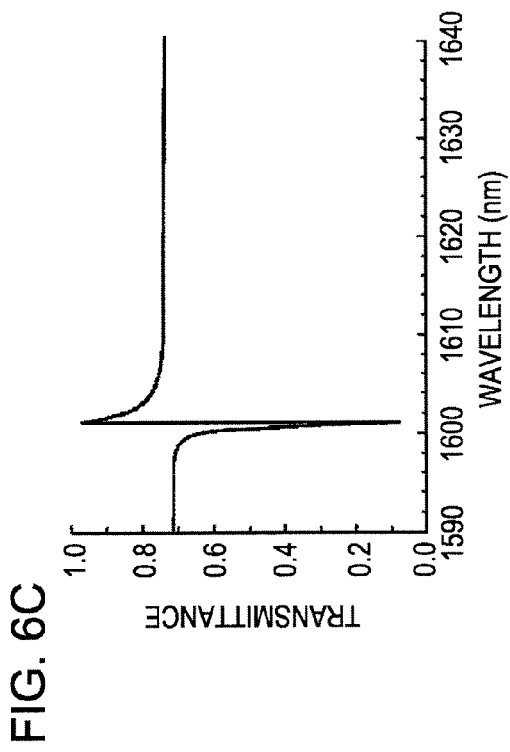

The relative refractive index difference $\Delta n$ between the slab and its adjoining clad layer is about 0.07 (about 7%). The half-width can be increased to about 1 nm by increasing the hole radius r (FIG. 6C). However, if the radius is further increased to increase the half-width more, guided resonance cannot be observed, as shown in FIG. 6D.

This is because the increase of the hole radius increases the volume of the holes, consequently reducing the effective refractive index.

Figure 7A:
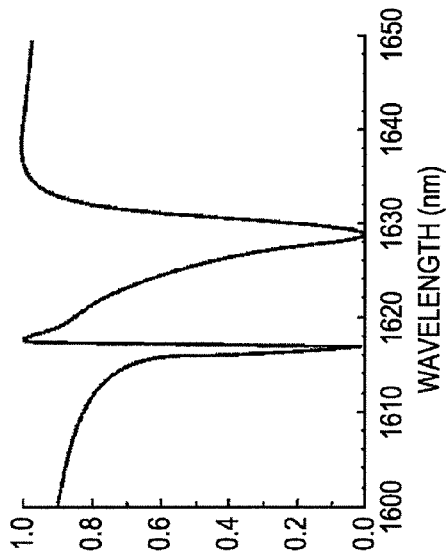
FIGS. 7A to 7C are charts of the transmission spectra of photonic crystal mirrors according to an embodiment of the present invention.

FIG. 7A shows the transmission spectrum according to simulation using the structure shown in FIG. 2A with the same parameters a, t, $n_1$, and $n_2$ as in the simulation shown in FIGS. 6A to 6D.

More specifically, the holes have a radius of 200 nm and a depth of 375 nm (50% of the thickness of the photonic crystal layer). The third member filling the holes has a refractive index $n_3$ of 1.7 (made of, for example, a thiourethane resin). In this structure according to the present embodiment and FIG. 2A, the half-width of the spectrum can be about 5 nm or more.

Figure 7B:
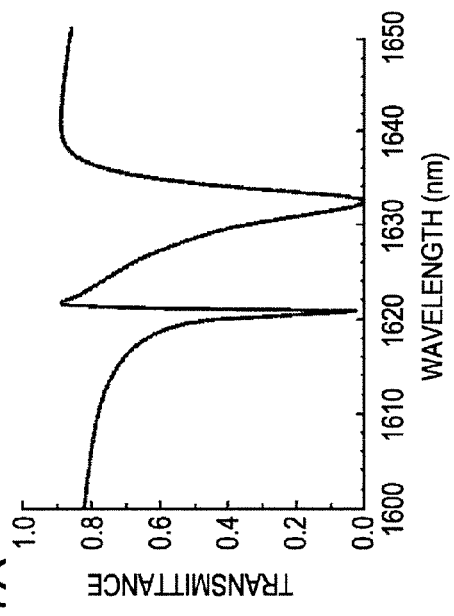
Figure 7C:
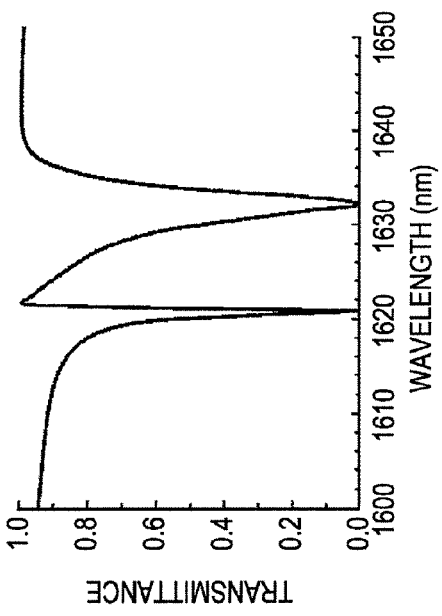
Figure 8:
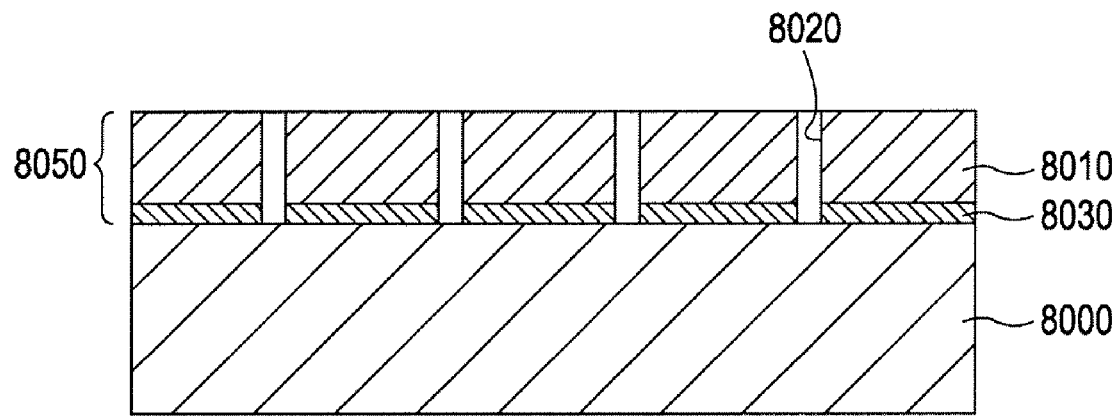
FIG. 8 is a photonic crystal described in a non-Patent Document, Optics Express, vol. 13, No. 17, p. 6564 (2005).

FIGS. 7B and 7C show the transmission spectra according to simulations using the structures shown in FIGS. 2B and 2C, respectively, performed under the same conditions as the simulation shown in FIG. 7A. Any case of FIGS. 7A to 7C exhibits a similar spectrum to each other and shows that guided resonance can be observed with a wide half-width maintained even though the relative refractive index difference $\Delta n$ is about 7%.

The above simulations are performed according to the transfer matrix method described in a document, Physical Review B, Vol. 68, 155101 (2003).

Second Embodiment

VCSEL Surface Emitting Laser

A vertical cavity surface emitting laser (VCSEL) according to an embodiment will now be described with reference to FIG. 5, which is a schematic sectional view of the VCSEL.

The VCSEL includes a substrate 5050, a lower reflection mirror 5000 (defined by, for example, a multilayer mirror), a lower clad layer 1021, an active layer 5900, an upper clad layer 5020, and a photonic crystal layer 1000 including a first member 1010 and a third member 1015 acting as the filler filling the holes.

The photonic crystal layer 1000 is formed by the technique described in the first embodiment. The upper clad layer 5020 corresponds to the second member 1020 of the first embodiment, doubling as a clad layer for the active layer 5900 and a low refractive index layer for the photonic crystal layer 1000.

In a VCSEL, light emitted from the active layer resonates with upper and lower mirrors to amplify, and thus laser oscillation occurs. The wavelength of light emitted from the active layer depends on the material and layered structure of the active layer. In the present embodiment, the photonic crystal layer 1000 acts as the upper reflection mirror, and is designed so that guided resonance occurs in the photonic crystal layer 1000 at the wavelength of the emitted light.

Figure 5:
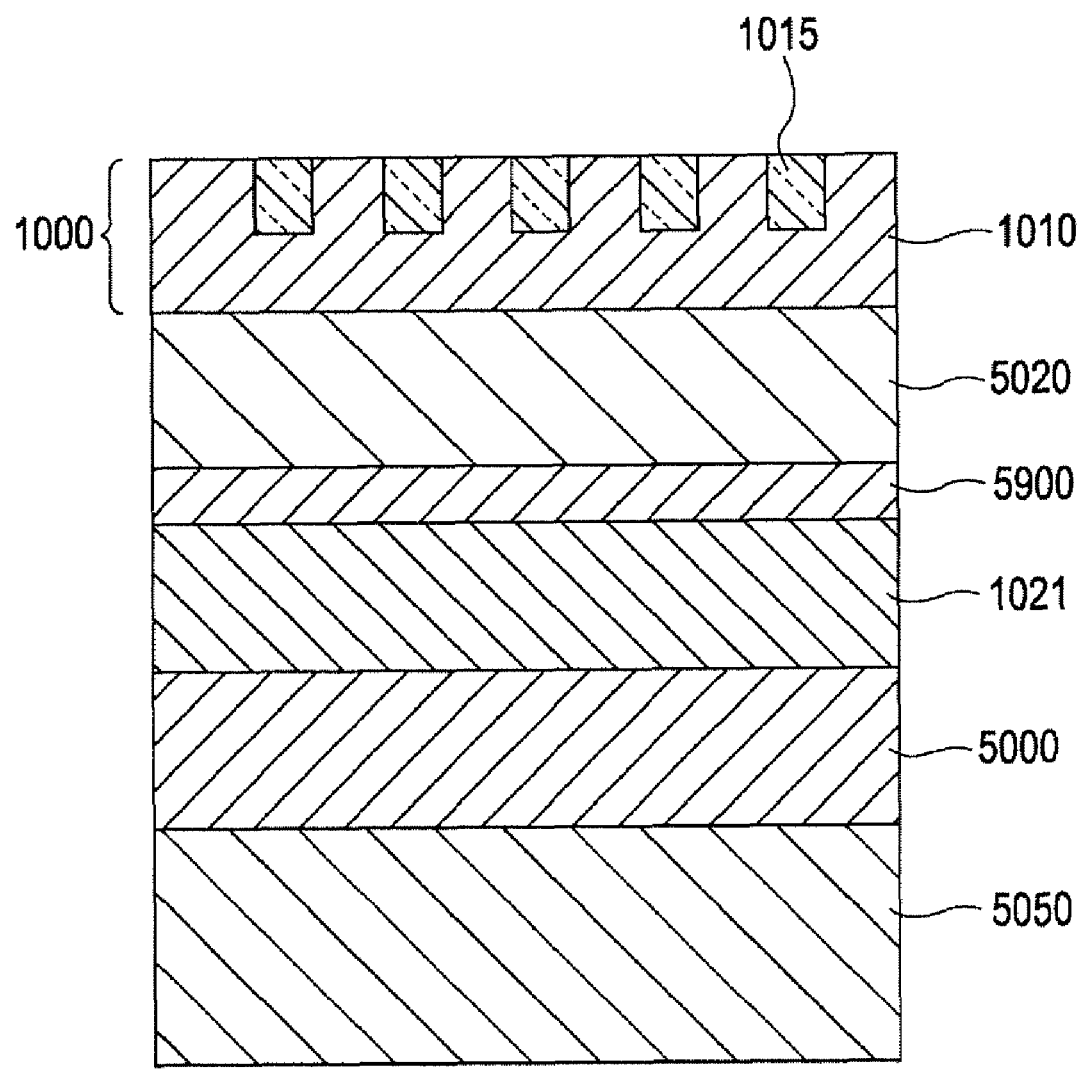
FIG. 5 is a schematic representation of a vertical cavity surface emitting laser (VCSEL) according to a second embodiment of the present invention.

By using the photonic crystal layer 1000 described in the first embodiment as the upper reflection mirror opposing the lower reflection mirror 5000, as shown in FIG. 5, a surface emitting laser can be achieved.

The lower reflection mirror may be defined by a multilayer mirror expressed by, for example, $Al_xGa_{1-x}As/Al_{x'}Ga_{1-x'}As$, $GaN/Al_xGa_{1-x}N$, or $In_xGa_{1-x}As_yP_{1-y}/In_{x'}Ga_{1-x'}As_{y'}P_{1-y'}$, or a photonic crystal as described in the first embodiment.

Active Layer, Clad Layer, Substrate, Etc.

The active layer 5900 has a multi-quantum well structure formed of, for example, GaInP/AlGaInP or GaN/InGaN.

The clad layer 1021 is made of, for example, AlGaInP or AlGaN.

The substrate 5050 is made of, for example, GaAs or GaN.

The VCSEL of the present embodiment can be operated by photoexcitation or current injection. FIG. 5 omits electrodes.

The mirror including the photonic crystal layer may be referred to as a first reflection mirror and the mirror opposing the first reflection mirror may be referred to as a second reflection mirror. The first reflection mirror may act as an upper reflection mirror or a lower reflection mirror.

Third Embodiment

DFB Surface Emitting Laser

Figure 14:
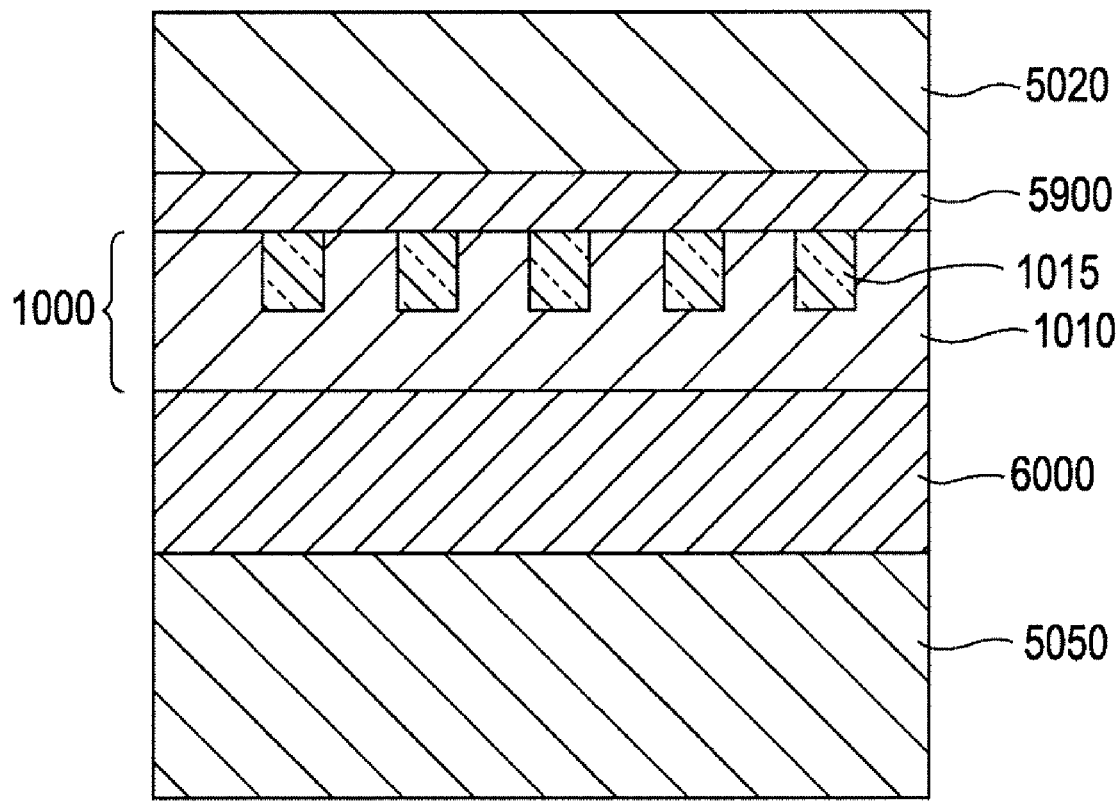
FIG. 14 is a schematic representation of a distributed feedback (DFB) laser according to a third embodiment.

A distributed feed-back (DFB) surface emitting laser according to an embodiment will now be described. FIG. 14 is a schematic sectional view of the DFB laser.

The DFB laser includes a substrate 5050, a clad layer 6000, a photonic crystal layer (may be referred to as an optical resonance layer) 1000 including a first member 1010 and a third member 1015, an active layer 5900, and an upper clad layer 5020. The clad layer 6000 doubles as a low refractive index layer (second member) for the photonic crystal layer 1000.

In the DFB surface emitting laser, light emitted from the active layer 5900 enters the photonic crystal layer 1000. The light enters a guided mode and resonates in the in-plane direction of the photonic crystal layer 1000 and amplifies. Then, the light is coupled with radiation mode light and emitted from the photonic crystal layer 1000. Consequently, coherent light is surface-emitted from the upper clad layer 5020.

Thus, the DFB surface emitting laser of the present embodiment does not necessarily require the lower reflection mirror 5000 described in the second embodiment.

The second member described in the first embodiment can be used as the clad layer 6000. The substrate 5050 and the active layer 5900 can be made of the same materials as in the first embodiment.

The active layer 5900 of the present embodiment may be disposed in any position as long as light emitted from the active layer 5900 can enter the photonic crystal layer 1000 acting as the optical resonance layer. In order to obtain a higher gain, the active layer 5900 is preferably disposed close to the photonic crystal layer. For example, the active layer 5900 may be disposed on the photonic crystal layer 1000, or inside the photonic crystal layer 1000.

While the clad layer 6000 acts as the low refractive index layer in the above description, the substrate 5050 may act as the low refractive index layer. Hence, the photonic crystal layer 1000 may be disposed on the substrate 5050.

EXAMPLES

Example 1

Mirror

Example 1 will illustrate a two dimensional photonic crystal mirror to which an embodiment of the present invention has been applied. FIG. 10D shows the structure of the mirror of Example 1.

The mirror shown in FIG. 10D has a GaN photonic crystal layer 1000 provided with cylindrical holes arranged in a tetragonal lattice manner. The photonic crystal layer 1000 has a thickness of 100 nm. The cylindrical holes are arranged at intervals of 200 nm and the holes have a radius of 60 nm and a depth of 40 nm (40% of the slab thickness). The holes are filled with a thiourethane resin having a refractive index of 1.7, and the upper surface of the photonic crystal layer is covered with a third member 1017 made of the same resin. The substrate 1020 is made of $Al_{0.4}Ga_{0.6}N$.

Figure 10A:
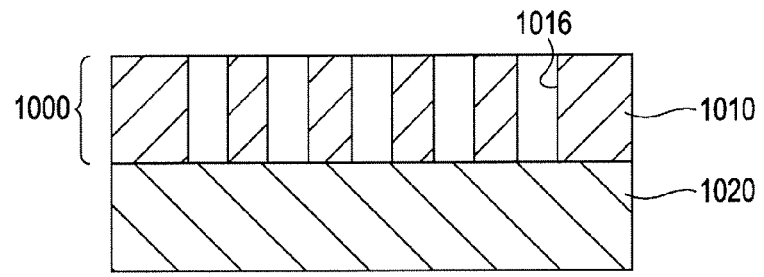
FIGS. 10A to 10D are schematic representations of photonic crystal mirrors of Example 1 and comparative examples.
Figure 10B:
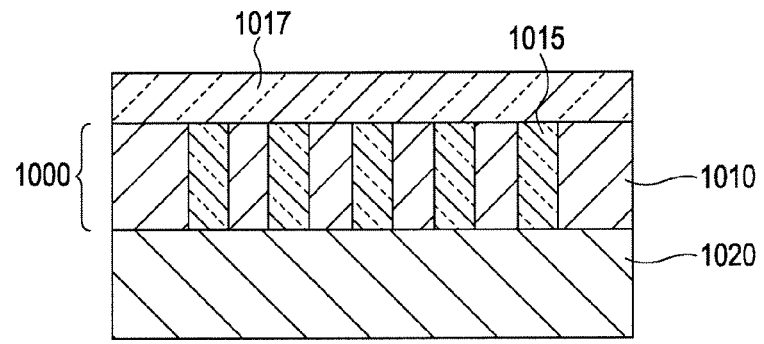
Figure 10C:
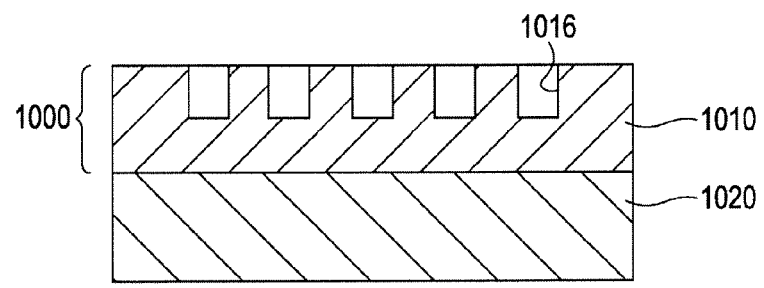
Figure 10D:
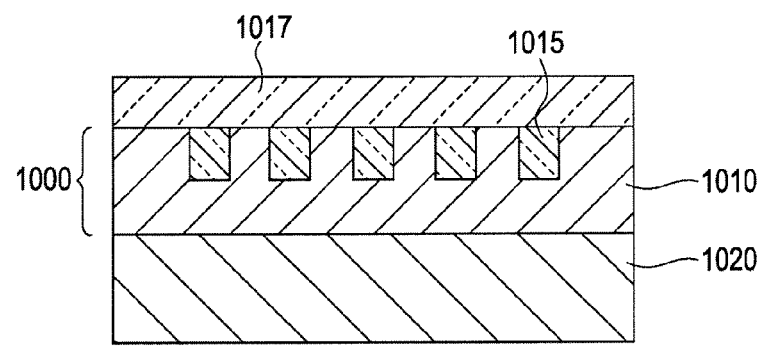
Figure 11A:
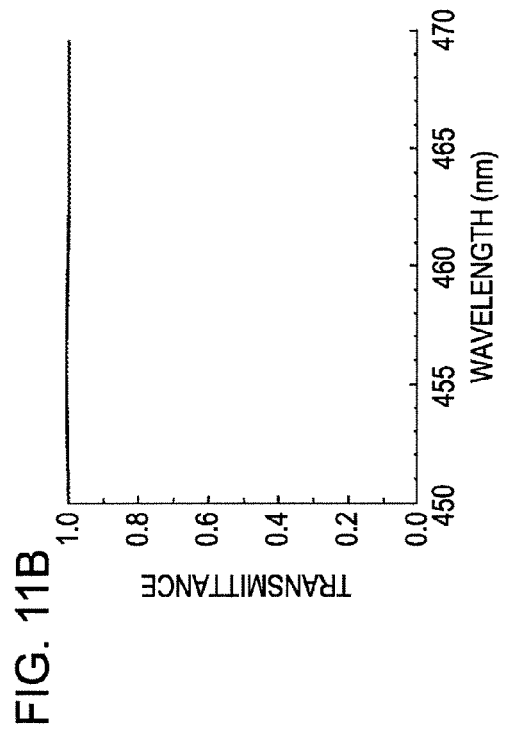
FIGS. 11A to 11D are charts of transmission spectra of the photonic crystal mirrors shown in FIGS. 10A to 10D.
Figure 11B:
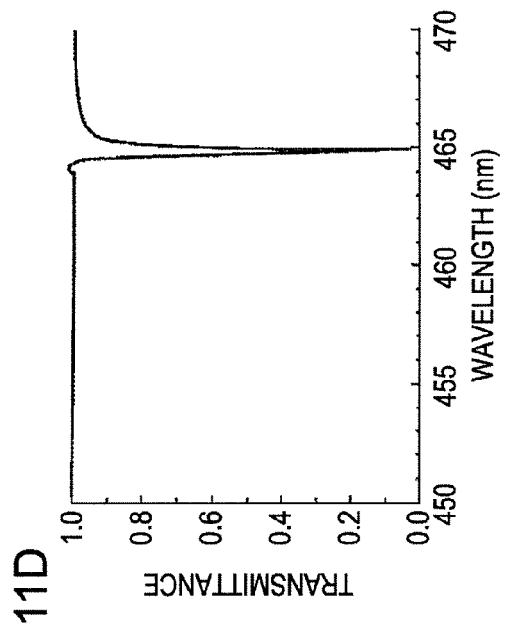
Figure 11C:
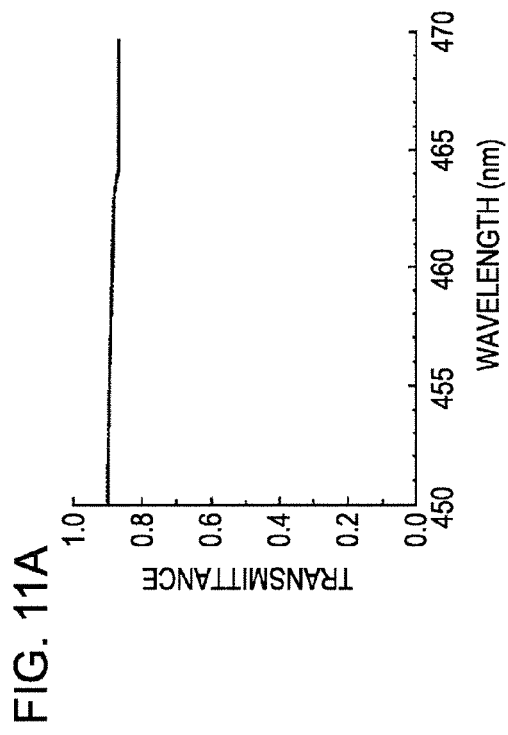
Figure 11D:
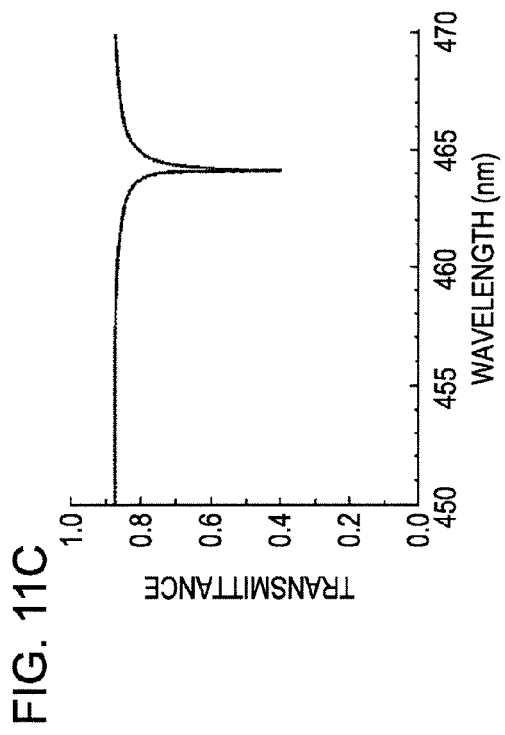

FIG. 11D shows a transmission spectrum of the structure shown in FIG. 10D obtained by calculation. For the calculation, it is assumed that GaN has a refractive index of 2.54 and that $Al_{0.4}Ga_{0.6}N$ has a refractive index of 2.32. The relative refractive index difference between them is about 8.7%. The thickness of the third member 1017 and the substrate 1020 are assumed to be infinite for the convenience of the calculation.

FIG. 11D shows that there is a region around a wavelength of 465 nm in which the transmittance rapidly drops (the reflectance rapidly increases); hence, this structure can serve as a high-reflectance mirror.

For comparison with Example 1, FIGS. 11A, 11B, and 11C show transmission spectra of the structures shown in FIGS. 10A, 10B, and 10C, respectively obtained by calculation. The structure shown in FIG. 10A has holes with a depth of 100 nm (100% of the slab thickness); the structure shown in FIG. 10B (b) has the same holes as FIG. 10A filled with a resin having a refractive index of 1.7; the structure shown in FIG. 10C has cylindrical holes with a depth of 40 nm (40% of the slab thickness). The structures shown in FIGS. 11A, 11B, and 11C do not have a wavelength region in which a high reflectance is exhibited with a transmittance of 10% or less (a reflectance of 90% or more).

In the structures shown in FIGS. 11A to 11CA, a satisfying mirror cannot be achieved only by a single technique of increasing the depth of the holes or filling the holes with a resin, and it is necessary to combine both techniques.

Example 2

VCSEL

Figure 12:
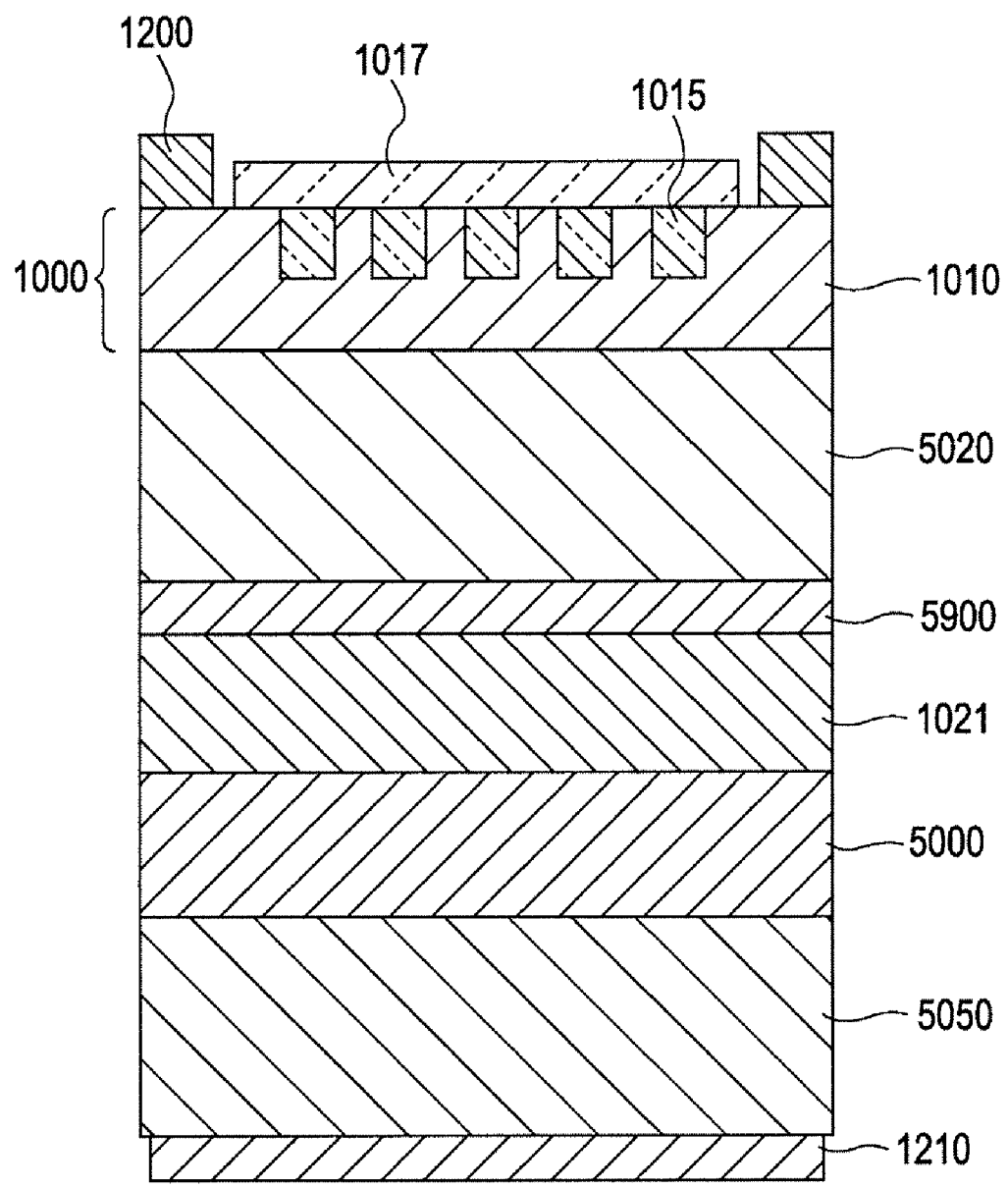
FIG. 12 is a schematic representation of a surface emitting laser of Example 2.

Example 2 will illustrate a vertical cavity surface emitting laser (VCSEL) to which an embodiment of the present invention is applied. FIG. 12 shows the structure of the VCSEL of Example 2.

The VCSEL shown in FIG. 12 has an $Al_{0.5}Ga_{0.5}As$ photonic crystal layer 1000 provided with cylindrical holes arranged in a tetragonal lattice manner. The photonic crystal layer 1000 has a thickness of 308 nm. The cylindrical holes are arranged at intervals of 205 nm and the holes have a radius of 82 nm and a depth of 154 nm (50% of the slab thickness). The holes are filled with an acrylic resin 1015 having a refractive index of 1.7 and the upper surface of the photonic crystal layer 1000 is covered with a member 1017 made of the same acrylic resin.

The VCSEL also includes a p-type AlGaInP clad layer 5020, a GaInP/AlGaInP multi-quantum well active layer 5900, an n-type AlGaInP clad layer 1021, an n-type $Al_{0.93}Ga_{0.07}As/Al_{0.5}Ga_{0.5}As$-DBR lower mirror layer 5000, and a GaAs substrate 5050. Reference numeral 1200 designates an upper ring electrode and reference numeral 1210 designates a lower electrode.

Figure 13:
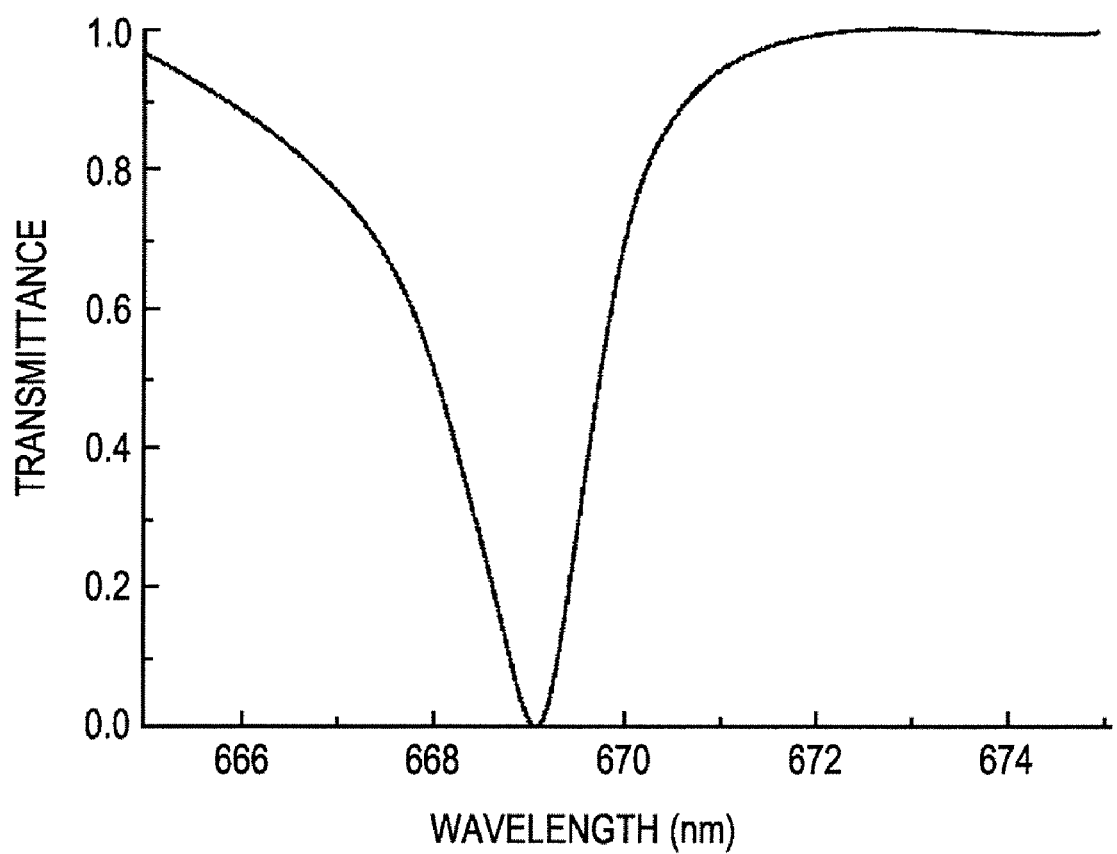
FIG. 13 is a chart of the transmission spectrum of the photonic crystal mirror used in a surface emitting laser of Example 2.

FIG. 13 shows a calculated transmission spectrum of the photonic crystal layer of the structure shown in FIG. 12. FIG. 13 shows that there is a region around a wavelength of 669 nm in which the structure can serve as a high-reflectance mirror.

The lower mirror layer 5000 is also designed so as to exhibit a high reflectance around a wavelength of 669 nm. The resonator length, which depends on the interval between the photonic crystal layer 1000 and the lower mirror layer 5000, is designed so that a loop of standing waves formed in the resonator coincides with the active layer 5900. This can be achieved by applying a common technique for designing surface emitting lasers.

The structure of Example 2 can achieve laser oscillation in which light emitted from the active layer 5900 resonates with upper and lower mirrors for amplification.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-310383 filed Nov. 16, 2006 and No. 2007-262270 filed Oct. 5, 2007, which are hereby incorporated by reference herein in their entirety.

What is claimed is:

1. A structure comprising:
    a photonic crystal layer including a first member having a first refractive index $n_1$ in which a plurality of holes are formed so as to be periodically arranged;
    a second member adjoining the photonic crystal layer, the second member having a second refractive index $n_2$ lower than the first refractive index; and
    a third member disposed on the first member, the third member having a third refractive index $n_3$ higher than 1.0 and lower than the first refractive index $n_1$,
    wherein the first refractive index $n_1$ and the second refractive index $n_2$ satisfy the relationship $(n_1-n_2)/n_1 \leq 0.10$, and the holes of the photonic crystal layer have a depth in the range of 20% to 80% of the thickness of the first member.

2. The structure according to claim 1, wherein the third member fills the holes of the photonic crystal layer.

3. The structure according to claim 1, wherein the third member is disposed over the photonic crystal layer.

4. The structure according to claim 1, wherein light guided in the photonic crystal layer in the in-plane direction of the photonic crystal layer is emitted to the outside of the photonic crystal layer.

5. A surface emitting laser comprising:
    a first reflection mirror including the structure as set forth in claim 1;
    a second reflection mirror opposing the first reflection mirror; and
    an active layer disposed between the first reflection mirror and the second reflection mirror.

6. The surface emitting laser according to claim 5, wherein the second reflection mirror includes the structure as set forth in claim 1.

7. A surface emitting laser comprising:
    an optical resonance layer including the structure as set forth in claim 1; and
    an active layer that emits light and is disposed so that the light from the active layer enters the optical resonance layer.

8. The surface emitting laser according to claim 7, wherein the active layer is disposed on the optical resonance layer.

9. The surface emitting laser according to claim 7, wherein the active layer is disposed inside the optical resonance layer.

* * * * *